(12) United States Patent
Yang et al.

(10) Patent No.: US 8,767,494 B2
(45) Date of Patent: Jul. 1, 2014

(54) FAR END RESISTANCE TRACKING DESIGN WITH NEAR END PRE-CHARGE CONTROL FOR FASTER RECOVERY TIME

(75) Inventors: Chen-Lin Yang, Zhubei (TW); Chung-Yi Wu, Taipei (TW); Yu-Hao Hsu, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 80 days.

(21) Appl. No.: 13/493,118

(22) Filed: Jun. 11, 2012

(65) Prior Publication Data

US 2013/0329505 A1  Dec. 12, 2013

(51) Int. Cl.
*G11C 7/00* (2006.01)
*G11C 8/00* (2006.01)

(52) U.S. Cl.
USPC .............. 365/203; 365/230.06; 365/233.1

(58) Field of Classification Search
USPC ................... 365/203, 203.06, 233.1
See application file for complete search history.

(56) References Cited

U.S. PATENT DOCUMENTS

| | | | | |
|---|---|---|---|---|
| 5,724,304 | A | * | 3/1998 | Foss ........................ 365/230.06 |
| 5,828,622 | A | * | 10/1998 | McClure .................. 365/230.06 |
| 5,973,992 | A | * | 10/1999 | Casper ..................... 365/230.06 |
| 7,848,174 | B2 | * | 12/2010 | Cheng et al. ............. 365/230.06 |
| 7,940,545 | B2 | * | 5/2011 | Sharma et al. ................ 365/203 |
| 8,223,572 | B2 | * | 7/2012 | Jain et al. ................. 365/230.06 |
| 2011/0085399 | A1 | | 4/2011 | Chen et al. |
| 2012/0008438 | A1 | | 1/2012 | Jain et al. |

* cited by examiner

*Primary Examiner* — Trong Phan
(74) *Attorney, Agent, or Firm* — Eschweiler & Associates, LLC

(57) ABSTRACT

A wordline tracking circuit and corresponding method are disclosed, and include a tracking wordline having an impedance characteristic associated therewith that models a row of memory cells in a memory device, wherein the tracking wordline has a near end that receives a wordline pulse signal having a near end rising pulse edge and a near end falling pulse edge. The tracking wordline also has a far end. A tracking cell component is coupled to the far end of the tracking wordline that receives the wordline pulse signal. Lastly, the circuit includes a tracking bitline pre-charge circuit coupled to the tracking cell that is configured to pre-charge a tracking bitline associated with the tracking cell using the near end wordline pulse signal.

20 Claims, 6 Drawing Sheets

FAR END RESISTANCE TRACKING DESIGN WITH NEAR END PRE-CHARGE CONTROL FOR FASTER RECOVERY TIME

BACKGROUND

Semiconductor memories, such as static random access memory (SRAM) or dynamic random access memory (DRAM), have large number of memory cells arranged in arrays. A particular memory cell inside an array is typically selected by a wordline and a pair of bitlines. The wordline is typically connected to one or more control gates of every memory cell in a row. In case the control gates are made of NMOS transistors, all the memory cells are turned on when the wordline connected thereto turns to a high voltage, i.e., to be activated. The bitline pair is typically connected to storage nodes of every memory cell in a column to a sense amplifier. The memory cell at the cross point of the activated wordline and the bitline pair is the one that is selected.

In a modern high density semiconductor memory, the wordline may be very long, especially when the word width becomes very large. The wordline has to be formed inevitably by one or more metal layers. Even so, delays caused by long wordline's resistance and capacitance pose performance limitations and reliability problems in such high density semiconductor memory. Especially with the advances of process technologies which shrink down metal width and thickness, the wordline's resistance becomes very significant in comparison with a drive transistor's channel resistance. For instance, for a wordline being connected to 256 cells, when in a 65 nm technology, the wordline resistance is about 300 ohm; but when in a nm 45 nm technology, the wordline resistance is 1027 ohm. At the same time, for a driver's PMOS transistor with a channel width of 10 um, when in a 65 nm technology, the channel resistance is 259 ohm; but when in a 45 nm technology, the channel resistance is 189 ohm. As a result, the ratio between wire resistance and transistor channel resistance drastically increases when technology advances. The higher ratio increases wordline slew time, which reduces effective wordline pulse width and degrades read/write margin or even causes malfunctions.

DETAILED DESCRIPTION

Figure 1:
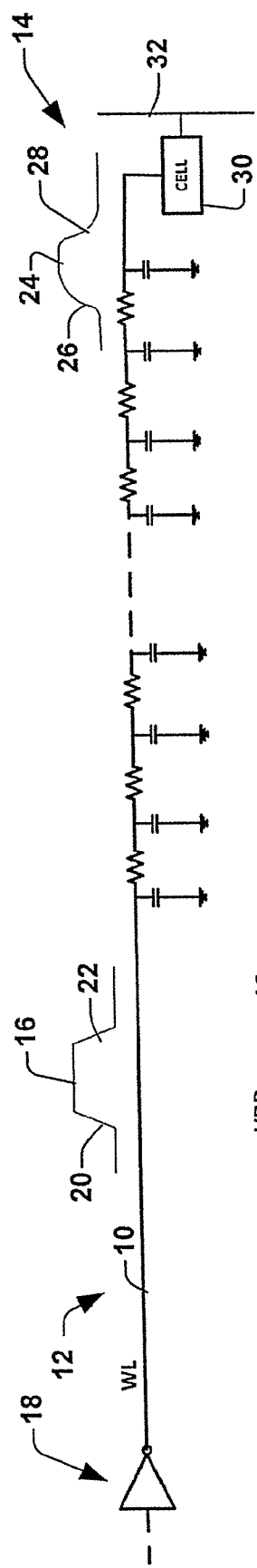
FIG. 1 is a circuit diagram of a wordline for a row of memory cells in a memory device having a memory cell illustrated as coupled to a far end of the wordline row.

One or more implementations or embodiment of the present disclosure will now be described with reference to the attached drawings, wherein like reference numerals are used to refer to like elements throughout. The drawings are not necessarily drawn to scale.

In advanced technologies such as, for example, the 28 nm technology node, backend interconnect resistance induced performance degradation is a significant issue. In a self-time SRAM design, for example, in order to generate a sufficient bitline differential voltage value to ensure a sufficiently robust read sensing function at the far end of a wordline, wordline tracking is employed to track the rising edge degradation of the wordline due to RC delay. The RC delay is modeled by a tracking wordline and the resultant modeled degradation of the rising edge wordline pulse is utilized to generate read timing for a sense amplifier. Referring to FIG. 1, a wordline (WL) 10 is illustrated having a near end 12 and a far end 14 associated therewith. A wordline pulse signal 16 is received by driver circuitry 18, and the pulse signal propagates down the wordline 10 from the near end 12 to the far end 14. The wordline pulse signal 16 has a rising edge 20 and a falling edge 22 associated therewith. As the wordline pulse 16 propagates along the wordline 10 the impedance characteristic associated therewith affects the pulse, resulting in a degradation thereof, wherein at the far end 14 of the wordline 10, a pulse signal 24 exists having a rising edge 26 and a falling edge 28 that differs from the near end wordline pulse 16. At the far end 14 of the wordline 10, a memory cell 30 is coupled thereto, having a corresponding bitline (BL) 32 associated therewith.

Figure 2:
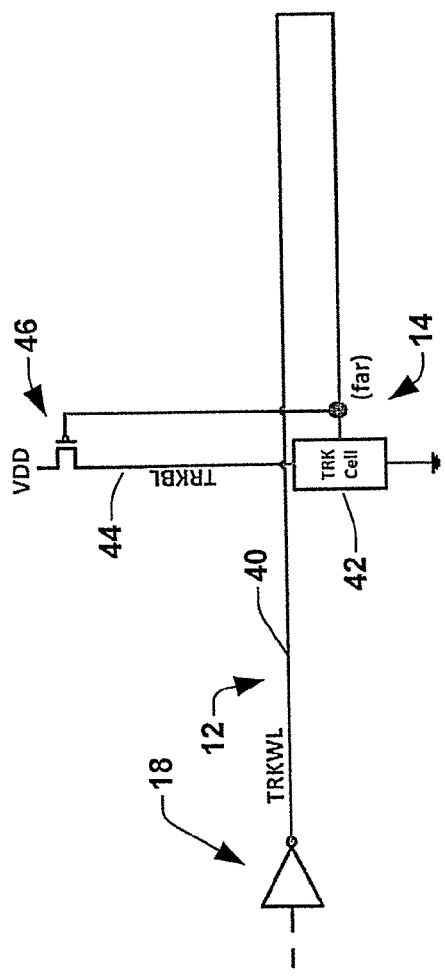
FIG. 2 is a circuit diagram illustrating a wordline tracking circuit having a tracking wordline that operates to model a wordline row such as the wordline row of FIG. 1.

Referring to FIG. 2, a tracking wordline 40 (TRKWL) is designed to model the behavior of the wordline 10 of FIG. 1. The tracking wordline 40 is also driven by driver circuitry 18 to provide a wordline pulse signal similar to pulse signal 16 at a near end 12. The length of the tracking wordline 40 is substantially the same as the wordline 10, and has substantially the same impedance characteristics, such that a degradation of the wordline pulse signal at a far end 14 of the tracking wordline 40 mirrors the degradation seen at the pulse signal 24 of FIG. 1. At the far end 14 of the tracking wordline 40 a tracking cell (TRK Cell) 42 is coupled to the tracking wordline 40, and a tracking bitline (TRKBL) 44 is coupled to the tracking cell 42. A pull-up device 46 is coupled to the tracking bitline and operates to charge the tracking bitline 44 back to a full VDD voltage.

Figure 3:
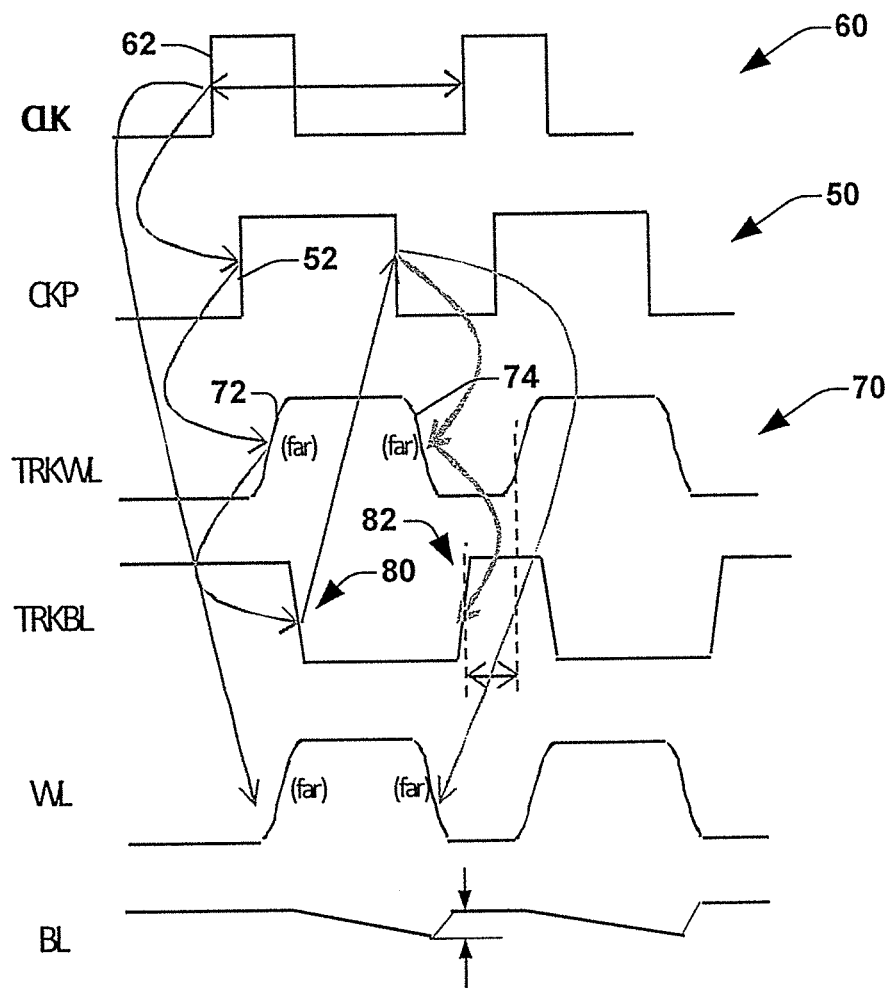
FIG. 3 is a series of timing diagrams that illustrate how the wordline tracking circuit of FIG. 2 operates.

The full operation of the tracking wordline 40 can be best appreciated in conjunction with the timing waveforms of FIG. 3. A CKP pulse 50 is the output from a self-timing generator driven by a clock signal CLK 60. As can be seen in FIG. 3, a rising edge 52 of CKP 50 is substantially synchronous with the clock signal CLK 60 at 62. The CKP pulse drives the driver circuitry 18, for example, to produce a tracking wordline pulse signal (TRKWL) 70. The waveform at 70 has deteriorated rising and failing edges 72 and 74 that reflect the signal degradation due to the impedance characteristic of the tracking wordline 40 at the far end 14 thereof, and thus are labeled "(far)" in FIG. 3 to reflect that behavior. The rising edge 72 of the tracking wordline pulse signal 70 causes the pull-up transistor 46 of FIG. 2 to turn off and the tracking cell 42 to be activated, thereby pulling the tracking bitline (TRKBL) 44 down to ground, as shown at 80 in FIG. 3. After the falling edge 74 of the tracking wordline pulse 70 arrives at the far end 14 of the tracking wordline 40, the tracking cell 42 becomes deactivated, and the pull-up device 46 turns on, resulting in a pre-charging of the tracking bitline 44 up to $V_{DD}$, as shown at 82 in FIG. 3. The inventors of the subject matter of this disclosure identified that the timing delay to re-charge the tracking bitline 44 is not desirable in an SRAM design, as the delay forms a cycle time constraint and thus slows down SRAM operation frequency. That is, the maximum cycle time is limited due to the constraint that the tracking bitline 44 needs to be charged back to a full $V_{DD}$ level before the next tracking wordline far end pulse can discharge it.

Figure 4:
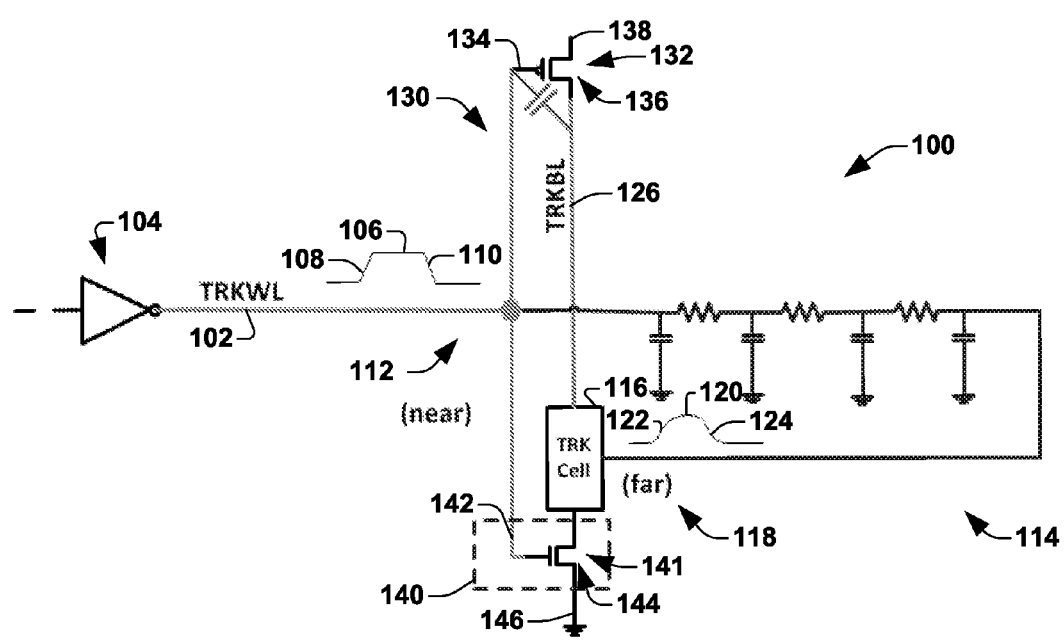
FIG. 4 is a circuit diagram illustrating a wordline tracking circuit comprising a tracking bitline pre-charge circuit in accordance with one embodiment of the disclosure.

A wordline tracking circuit 100 according to one embodiment of the disclosure is provided in FIG. 4. The wordline tracking circuit 100 comprises a tracking wordline 102 (TRKWL) that is driven by driver circuitry 104, that receives a wordline pulse signal 106 having a rising edge 108 and a falling edge 110 at a near end (near) 112 of the tracking wordline 102. The tracking wordline 102 extends along a length 114 that models a length of a row of memory cells along a wordline of a memory device. A tracking cell 116 is coupled to a far end (far) 118 of the tracking wordline 102. The wordline pulse signal 106 propagates along the length 114 of the tracking wordline 102 from the near end 112 to the far end 118 thereof, wherein an impedance characteristic of the tracking wordline 102 delays and degrades the wordline pulse signal to a pulse signal 120 having a rising edge 122 and a falling edge 124, respectively.

Still referring to FIG. 4, a tracking bitline 126 is coupled to the tracking cell 116. A tracking bitline pre-charge circuit 130 is also provided and operates to pre-charge the tracking bitline 126 associated with the tracking cell 116 using the near end wordline pulse signal 106. More particularly, in one embodiment of the disclosure, the tracking bitline pre-charge circuit 130 is configured to pre-charge the tracking bitline 126 using the falling edge 110 of the near end wordline pulse signal 106.

In one embodiment of the disclosure, the tracking bitline pre-charge circuit 130 comprises a pull-up component 132 that is configured to pull a potential of the tracking bitline 126 up to a first predetermined potential, for example, $V_{DD}$, thus pre-charging the tracking bitline 126. The pull-up component 132, in one embodiment, comprises a PMOS transistor that has a gate terminal 134 coupled to the tracking wordline 102 at the near end 112 thereof. The PMOS transistor 132 further comprises a source/drain path 136 that is coupled between the first predetermined potential 138 and the tracking bitline 126. The PMOS transistor 132 operates to turn on and pull the tracking bitline 126 up to the first predetermined potential 138 based on the near end falling edge 110 of the near end wordline pulse 106.

Still referring to FIG. 4, in one embodiment the tracking bitline pre-charge circuit 130 further comprises a cut-off component 140 that is configured to interrupt a current path in the tracking bitline 126 for a specified time period. More particularly, in one embodiment the cut-off component 140 comprises an NMOS transistor 141 having a gate terminal 142 coupled to the near end 112 of the tracking wordline 102, a source/drain path 144 coupled between the tracking cell 116 and a second predetermined potential 146, for example, a circuit ground potential. As will be more fully appreciated later, the cut-off component 140 operates to cut off a crowbar current to circuit ground 146 that is caused by the asynchronous pre-charging and subsequent discharging of the tracking bitline 126 due to near end 112/far end 118 timing differences.

Figure 5:
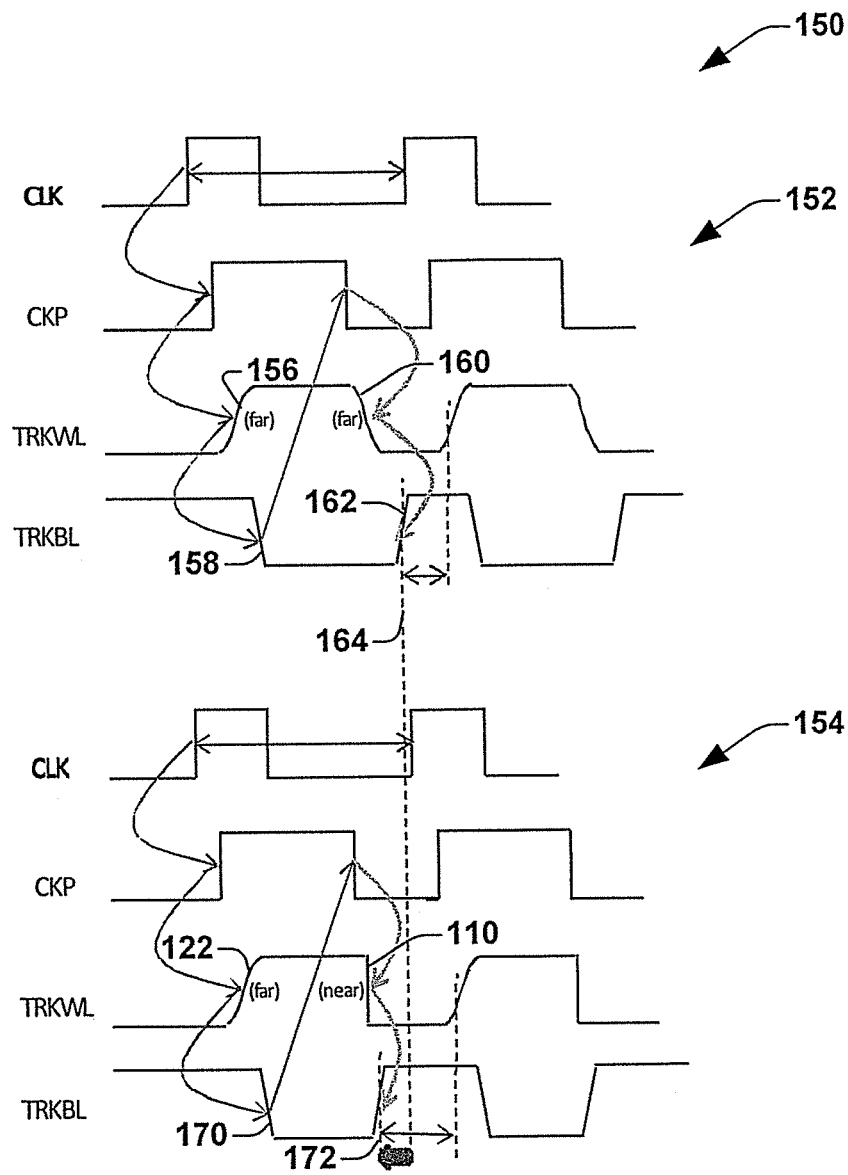
FIG. 5 is a series of timing diagrams illustrating the operation of the wordline tracking circuit of FIG. 2 compared to the operation of the wordline tracking circuit having the tracking bitline pre-charge circuit of FIG. 4.

Referring to FIG. 5, a series of timing diagrams 150 are provided, wherein a first set of timing diagrams 152 is directed to the conventional solution of FIG. 2, while a second set of timing diagrams 154 is directed to the solution employing the tracking bitline pre-charge circuit 130 of FIG. 4. As seen in the first set of timing diagrams 150, when the far end 14 wordline pulse transitions from low to high (a rising edge 156), the tracking cell 42 of FIG. 2 is activated, thus causing the tracking bitline 44 to be discharged at 158. Subsequently, when the far end wordline pulse transitions from high to low (a falling edge 160), the tracking cell 42 is deactivated and the pull-up component 46 of FIG. 2 turns on, thus causing the tracking bitline 44 to be pulled up to $V_{DD}$ at 162, thereby being pre-charged. As can be seen at 160 and 162, a time 164 at which the pre-charge occurs is dictated by the far end falling edge 160 of the tracking wordline pulse.

Still referring to FIG. 5, the wordline tracking circuit 100 operation of FIG. 4 is illustrated in the second set 154 of timing diagrams. When the wordline pulse propagates down to the far end 118, the transition from low to high (the rising edge 122) activates the tracking cell 116, causing the tracking bitline 126 to be pulled low, or discharged, at 170. Subsequently, due to the pull-up component 132 having its control terminal 134 coupled to the near end 112 of the tracking wordline 102, the falling edge 110 of the near end wordline pulse 110 occurs earlier in time than the corresponding far end falling edge 124 (due to the propagation time along the tracking wordline 102 from the near end 112 to the far end 118) and also is a more abrupt transition due to the pulse not having degraded due to the impedance characteristics of the tracking wordline 102. Consequently, a time 172 at which the pull-up component 132 pulls the tracking bitline 126 up to the first predetermined potential 138 occurs sooner than time 164 of the conventional solution. Thus the tracking bitline pre-charge circuit 130 improves the speed of charging up the tracking bitline since the near end wordline tracking pulse 106 sees substantially no tracking wordline resistance and only local capacitive loading. This improvement in speed of charging back the tracking bitline 126 improves the memory cycle time.

Returning to FIG. 4, a brief description of the function performed by the cut-off component 140 is provided. The leading edge 122 of the far end wordline pulse 120 activates the tracking cell 116 and thus allows it to conduct. Because the pull-up component is now activated by the near end falling edge 110 of the wordline pulse 106, a short time period exists (i.e., a time period associated with the time it takes for the wordline pulse to propagate from the near end 112 to the far end 118 of the tracking wordline 102) in which a short circuit path would otherwise exist on the tracking bitline 126 from the first potential 138, through the pull-up component 132, through the tracking cell to the second predetermined potential 146. To prevent this crowbar current, a cut-off component 140 in the path is also deactivated by the near end wordline pulse 106, for example, the falling edge 110 of the near end wordline pulse 106, such that the current path that would otherwise exist for that short circuit path is interrupted by the cut-off component 140 being turned off during that time period.

Still referring to FIG. 4, a further advantage of the pull-up component 132 coupled to the near end 112 of the tracking wordline 102 is that if the pull-up component is implemented using a PMOS transistor, a gate-to-drain capacitance (Cgd) of the PMOS transistor creates a coupling of a rising edge 108 of the tracking wordline pulse 106 to the tracking bitline 126 that can increase the read margin by pre-charging the tracking bitline 126 to a level even higher than the first predetermined potential 138.

Figure 6:
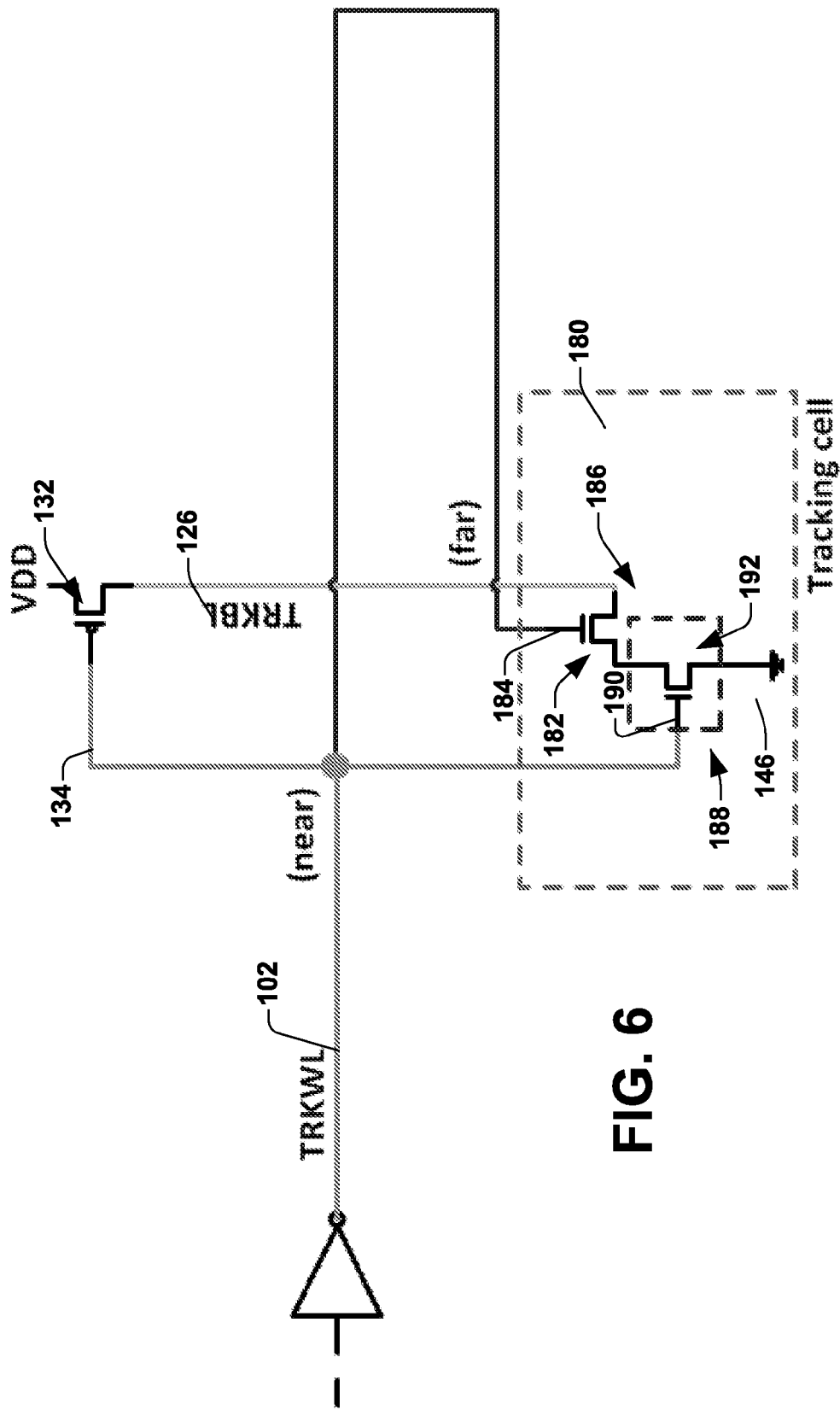
FIG. 6 is a circuit diagram illustrating a wordline tracking circuit comprising a tracking bitline pre-charge circuit having a cut-off component integrated within a tracking cell according to one embodiment of the disclosure.

Turning now to FIG. 6, another embodiment of the disclosure is provided, wherein a tracking cell 180 at the end of the tracking wordline 102 incorporates the cut-off component therein. The tracking cell 180 comprises a pass gate device 182 having a gate terminal 184 coupled to the far end 118 of the tracking wordline 102, and includes a controllable current path 186 coupled to the tracking bitline 126. The tracking cell 180 further comprises a pull-down component 188 having a control terminal 190 coupled to the near end 112 of the tracking wordline 102 and a controllable current path 192 coupled between the controllable current path 186 of the pass gate device 182 and a second predetermined potential 146 such as circuit ground. The tracking cell 180 of FIG. 6 allows for similar operation to the circuit 100 of FIG. 4 while not requiring the additional cut-off component 140, wherein the pull-down component 188 of the tracking cell 180 performs the same function.

Figure 7:
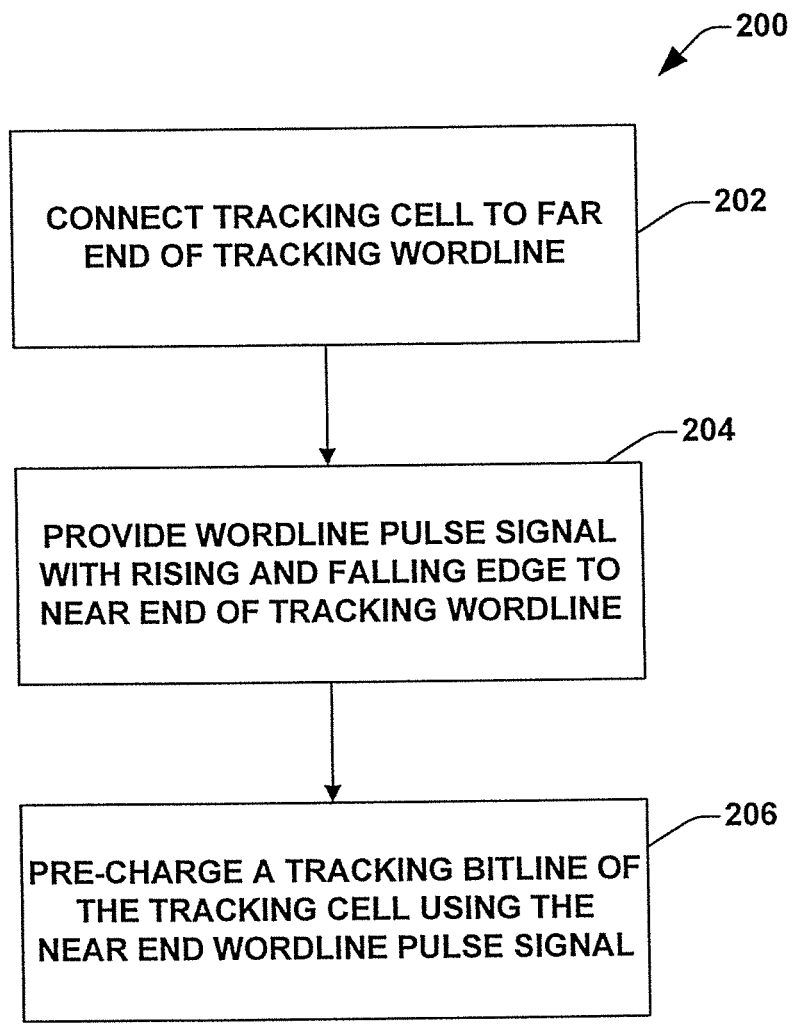
FIG. 7 is a flow chart diagram illustrating a method of performing wordline tracking according to one embodiment of the disclosure.

Turning now to FIG. 7, a method 200 of performing wordline tracking is disclosed according to one embodiment of the disclosure. While the method 200 is illustrated and described below as a series of acts or events, it will be appreciated that the present disclosure is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present disclosure.

The method 200 starts at 202, wherein a tracking cell is connected to a far end of a tracking wordline having an impedance characteristic that models a row of memory cells in a memory device. In one embodiment this may include a tracking cell 116 coupled to the far end 118 of the tracking wordline 102, as illustrated in FIG. 4. The method 200 continues at 204 by providing a wordline pulse signal having a rising edge and a falling edge to the near end of the tracking wordline. The wordline pulse signal propagates down the tracking wordline from the near end to the far end, wherein the wordline pulse at the far end exhibits a rising edge and a falling edge that differs from the rising edge and the falling edge of the near end pulse, respectively. This may appear like the near end wordline pulse 106 and the far end wordline pulse 120 illustrated in FIG. 4 in one embodiment.

Still referring to FIG. 7, the method 200 continues at 206 by pre-charging a tracking bitline associated with the tracking cell using the near end wordline pulse signal. In one embodiment such pre-charging may be performed with a tracking bitline pre-charge circuit such as the circuit 130 of FIG. 4. Further, in one embodiment the pre-charging is performed by triggering a pre-charge component using a falling edge of the near end wordline pulse signal such as the falling edge 110 of the near end wordline pulse signal 106 of FIG. 4, in one embodiment. The method 200 may further include interrupting a current path of the tracking bitline during at least a portion of the tracking bitline pre-charging to avoid crowbar current. Such interrupting may be performed using a cut-off component 140 as illustrated in FIG. 4 or a pull-down component 18 within the tracking cell 180, as illustrated in FIG. 6, wherein in either case the interruption is triggered by the falling edge 110 of the wordline pulse signal 106.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A wordline tracking circuit, comprising:
a tracking wordline having an impedance characteristic associated therewith that models a row of memory cells in a memory device, the tracking wordline having a near end that receives a wordline pulse signal having a near end rising pulse edge and a near end falling pulse edge, and the tracking wordline having a far end;
a tracking cell component coupled to the far end of the tracking wordline that receives the wordline pulse signal that due to the impedance characteristic of the tracking wordline exhibits a far end rising pulse edge and a far end falling pulse edge that differ from the near end rising pulse edge and the near end falling pulse edge, respectively; and
a tracking bitline pre-charge circuit coupled to the tracking cell, and configured to pre-charge a tracking bitline associated with the tracking cell using the near end wordline pulse signal.

2. The wordline tracking circuit of claim 1, wherein tracking bitline precharge circuit is configured to pre-charge the tracking bitline using the falling edge of the near end wordline pulse signal.

3. The wordline tracking circuit of claim 1, wherein the tracking bitline precharge circuit comprises a pull-up component configured to pull a potential of the tracking bitline up to a first predetermined potential in response to a transition in the near end wordline pulse signal.

4. The wordline tracking circuit of claim 3, wherein the pull-up component comprises a PMOS transistor having a gate terminal coupled to the tracking wordline at the near end thereof, and a source/drain path coupled between the first predetermined potential and the tracking bitline, and wherein the near end falling edge of the wordline pulse signal results in the PMOS transistor turning on and pulling the tracking bitline up to the first predetermined potential.

5. The wordline tracking circuit of claim 3, wherein the tracking bitline precharge circuit further comprises a cut-off component configured to interrupt a current path in the tracking bitline for at least a time period between a time of the transition in the near end wordline pulse signal and a time the transition takes to propagate along the tracking wordline and reach the far end thereof as a corresponding transition in the far end wordline pulse signal.

6. The wordline tracking circuit of claim 5, wherein the cut-off component comprises an NMOS transistor having a gate terminal coupled to the tracking wordline at the near end thereof, and a source/drain path coupled between the tracking cell and a second predetermined potential that is different than the first predetermined potential, and wherein the near end falling edge of the wordline pulse signal results in the NMOS transistor turning off and interrupting the current path.

7. The wordline tracking circuit of claim 1, wherein the tracking bitline precharge circuit further comprises a cut-off component configured to interrupt a current path in the tracking bitline for at least a time period between a time of the transition in the near end wordline pulse signal and a time the transition takes to propagate along the tracking wordline and reach the far end thereof as a corresponding transition in the far end wordline pulse signal.

8. The wordline tracking circuit of claim 1, wherein the tracking cell comprises:
   a pass gate device having a control terminal coupled to the far end of the tracking wordline, and a controllable current path coupled to the tracking bitline; and
   a pull-down component having a control terminal coupled to the tracking wordline at the near end thereof, and a controllable current path coupled between the controllable current path of the pass gate device and a circuit ground potential.

9. The wordline tracking circuit of claim 8, wherein the pull-down component is configured to operate as a cut-off component and interrupt a current path associated with the tracking bitline when the falling edge of the near end wordline pulse signal occurs.

10. The wordline tracking circuit of claim 8, wherein the pass gate device comprises a first NMOS transistor having a gate terminal as the control terminal of the pass gate device, and a source/drain path as the controllable current path of the pass gate device.

11. The wordline tracking circuit of claim 10, wherein the pull-down component comprises a second NMOS transistor having a gate terminal as the control terminal of the pull-down component, and a source/drain path as the controllable current path of the pull-down component.

12. A method of performing wordline tracking in a memory device, comprising:
   connecting a tracking cell to a far end of a tracking wordline having an impedance characteristic that models a row of memory cells in the memory device;
   providing a wordline pulse signal having a rising edge and a falling edge to a near end of the tracking wordline, wherein the wordline pulse signal propagates along the tracking wordline from the near end to the far end thereof, and wherein the wordline pulse signal at the far end exhibits a rising edge and a falling edge that differs from the rising edge and the falling edge of the wordline pulse signal at the near end; and
   pre-charging a tracking bitline associated with the tracking cell using the near end wordline pulse signal.

13. The method of claim 12, wherein pre-charging the tracking bitline using the near end wordline pulse signal comprises triggering a pre-charge component using a falling edge of the near end wordline pulse signal.

14. The method of claim 13, wherein triggering the pre-charge component comprises activating a pull-up component that, upon activation, pulls the tracking bitline up to a first predetermined potential.

15. The method of claim 12, further comprising interrupting a current path of the tracking bitline during at least a portion of the pre-charging of the tracking bitline.

16. The method of claim 15, wherein interrupting the current path comprises deactivating a switch in the current path using the near end wordline pulse signal.

17. The method of claim 16, wherein the switch is deactivated in response to the falling edge of the near end wordline pulse signal.

18. A wordline tracking circuit, comprising:
   a tracking wordline having an impedance characteristic associated therewith that models a row of memory cells in a memory device, the tracking wordline having a near end that receives a wordline pulse signal having a near end rising pulse edge and a near end falling pulse edge, and the tracking wordline having a far end;
   a tracking cell component coupled to the far end of the tracking wordline that receives the wordline pulse signal that due to the impedance characteristic of the tracking wordline exhibits a far end rising pulse edge and a far end falling pulse edge that differ from the near end rising pulse edge and the near end falling pulse edge, respectively; and
   a tracking bitline pre-charge circuit coupled to the tracking cell, and configured to pre-charge a tracking bitline associated at a time period before the falling edge of the far end wordline pulse signal.

19. The wordline tracking circuit of claim 18, wherein the tracking bitline pre-charge circuit comprises a pull-up component configured to pull a potential of the tracking bitline up to a first predetermined potential in response to a transition in the near end wordline pulse signal.

20. The wordline tracking circuit of claim 19, wherein the transition in the near end wordline pulse signal comprises a rising edge of the near end wordline pulse signal.

* * * * *